(12) United States Patent
Suzuki

(10) Patent No.: US 6,995,829 B2
(45) Date of Patent: Feb. 7, 2006

(54) PROJECTION OPTICAL SYSTEM, EXPOSURE APPARATUS, AND DEVICE MANUFACTURING METHOD

(75) Inventor: Masayuki Suzuki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 129 days.

(21) Appl. No.: 10/699,933

(22) Filed: Nov. 4, 2003

(65) Prior Publication Data

US 2004/0135984 A1 Jul. 15, 2004

(30) Foreign Application Priority Data

Nov. 8, 2002 (JP) ...................... 2002-325352

(51) Int. Cl.
*G03B 27/42* (2006.01)

(52) U.S. Cl. .................. 355/53; 355/67; 359/857; 250/492.2

(58) Field of Classification Search ............. 355/53, 355/67–71; 359/364, 365, 857–859; 250/492.2, 250/492.1
See application file for complete search history.

(56) References Cited

U.S. PATENT DOCUMENTS

| 5,686,728 | A | 11/1997 | Shafer | 250/492.2 |
|---|---|---|---|---|
| 5,767,962 | A | 6/1998 | Suzuki et al. | 356/237 |
| 5,815,310 | A | 9/1998 | Williamson | 359/365 |
| 6,033,079 | A | 3/2000 | Hudyma | 359/857 |
| 6,172,825 | B1 | 1/2001 | Takahashi | 359/859 |
| 6,255,661 | B1 * | 7/2001 | Braat | 250/492.2 |
| 6,353,470 | B1 | 3/2002 | Dinger | 355/71 |
| 6,396,067 | B1 | 5/2002 | Braat | 250/492.2 |
| 6,556,648 | B1 | 4/2003 | Bal et al. | 378/34 |
| 2002/0012107 | A1 | 1/2002 | Suzuki | 355/52 |
| 2002/0171048 | A1 | 11/2002 | Braat | 250/492.2 |
| 2003/0063375 | A1 | 4/2003 | Suzuki et al. | 359/359 |
| 2004/0051857 | A1 * | 3/2004 | Hudyma et al. | 355/67 |

FOREIGN PATENT DOCUMENTS

| JP | 2000-100694 | 4/2000 |
|---|---|---|
| JP | 2000-235144 | 8/2000 |
| JP | 2003-45782 | 2/2003 |
| JP | 2004-516500 | 6/2004 |
| WO | WO 02/48796 A2 | 6/2002 |

\* cited by examiner

*Primary Examiner*—D. Rutledge
(74) *Attorney, Agent, or Firm*—Fitzpatrick, Cella, Harper & Scinto

(57) ABSTRACT

Disclosed is a projection optical system specifically to be used with extreme ultraviolet (EUV) light having a wavelength not less than 10 nm and not greater than 20 nm. The projection optical system has six mirrors sequentially reflecting light in an order from the object side toward the image side and being disposed to define a coaxial system, wherein each of the six mirrors has a curvature radius not greater than 1500 mm.

20 Claims, 4 Drawing Sheets

PROJECTION OPTICAL SYSTEM, EXPOSURE APPARATUS, AND DEVICE MANUFACTURING METHOD

FIELD OF THE INVENTION AND RELATED ART

This invention relates to a projection optical system for projecting a pattern of a reticle in a reduced scale, by use of EUV (extreme ultraviolet) light. More particularly, the invention concerns a projection optical system for performing reduction projection by use of a plurality of mirrors, of a number of about six, for example.

A projection optical system for performing reduction projection by use of mirrors of a number of about six, is disclosed in, for example, U.S. Pat. Nos. 5,686,728, 6,172,825 (Japanese Laid-Open Patent Application No. 2000-100694), or U.S. Pat. No. 6,353,470 (Japanese Laid-Open Patent Application No. 2000-235144).

However, in the projection optical systems disclosed in these documents, one or more mirrors (in many cases, the first or second mirror in the order from the reticle side) have a curvature radius having a large absolute value, such as 1600 mm or more. In fact, in the examples among these projection optical systems in which the second mirror in the order from the reticle side is very the mirror that is placed closest to the reticle, the curvature radius of one or more mirrors has a very large absolute value, such as an enormous value of 2000 mm or more.

If the curvature radius of a mirror is large, the size of a measuring machine such as an interferometer system required for measuring the curvature radius or shape of the reflection surface (aspherical surface) of the mirror becomes too large. For example, in order to measure the surface shape of a concave mirror having a curvature radius of 2000 mm by use of an interferometer, the concave mirror must be placed at a position away from the measurement beam convergence position by 2000 mm or more.

In such interferometer, since the distance between the reflection surface of the mirror (subject of measurement) and a reference surface is more than 2000 mm, the measurement is easily influenced by fluctuation of the refractivity of the ambience such as air. Further, although it depends on the type of interferometer used, the visibility of interference fringe decreases due to the relation of coherence length. Hence, the precision for the measurement of surface shape or curvature radius of the mirror is quite low.

As described, in conventional projection optical systems, there is a problem that the measurement precision for the surface shape of one or more mirrors is low and, thus, the mirror surface-shape precision is low. For this reason, the imaging performance of a projection optical system can not be improved easily.

SUMMARY OF THE INVENTION

It is accordingly an object of the present invention to provide a projection optical system by which the above-described problem can be solved or reduced.

In accordance with an aspect of the present invention, there is provided a projection optical system for performing reduction projection of a pattern of a reticle, comprising: a first mirror having a concave surface shape; a second mirror having a concave surface shape; a third mirror having a convex surface shape; a fourth mirror having a concave surface shape; a fifth mirror having a convex surface shape; and a sixth mirror having a concave surface shape, wherein said first to sixth mirrors being disposed in the named order along an optical path from the reticle side, and wherein each of the six mirrors has a curvature radius having an absolute value not greater than 1500 mm.

In one preferred form of this aspect of the present invention, the projection optical system further comprises an aperture stop disposed adjacent said second mirror.

Among the six mirrors, said second mirror may have a curvature radius having a largest absolute value.

Among the six mirrors, said first mirror may have a curvature radius having a largest absolute value.

Among the six mirrors, said second mirror may be disposed closest to the reticle.

Among the six mirrors, the or each mirror having an effective diameter greater than 400 mm may have a curvature radius having an absolute value not greater than 1000 mm.

Each of the six mirrors may have a reflection surface of aspherical shape.

Five mirrors of the six mirrors may have a curvature radius having an absolute value not greater than 1300 mm.

Five mirrors of the six mirrors may have a curvature radius having an absolute value not greater than 1250 mm.

Four mirrors of the six mirrors may have a curvature radius having an absolute value not greater than 700 mm.

Four mirrors of the six mirrors may have a curvature radius having an absolute value not greater than 630 mm.

The first mirror may have a conic coefficient k1 that satisfies a relation $50<k1<150$.

The first mirror may have a conic coefficient k1 that satisfies a relation $80<k1<130$.

The fifth mirror may have a conic coefficient k5 that satisfies a relation $5<k5<20$.

The fifth mirror may have a conic coefficient k5 that satisfies a relation $7.5<k5<12$.

The projection optical system may perform reduction projection of the reticle pattern by use of extreme ultraviolet light.

The projection optical system may be constituted only by said first, second, third, fourth, fifth and sixth mirrors.

In accordance with another aspect of the present invention, there is provided an exposure apparatus, comprising: a projection optical system as recited above, for performing reduction projection of a pattern of a reticle; and an illumination optical system for illuminating the reticle with extreme ultraviolet light.

In one preferred form of this aspect of the present invention, the projection optical system is constituted only by the first, second, third, fourth, fifth and sixth mirrors, wherein the extreme ultraviolet light from the reticle is directed by these six mirrors to a substrate to be exposed.

In accordance with a further aspect of the present invention, there is provided a device manufacturing method, comprising the steps of: exposing a substrate with a device pattern by use of an exposure apparatus as recited above; and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
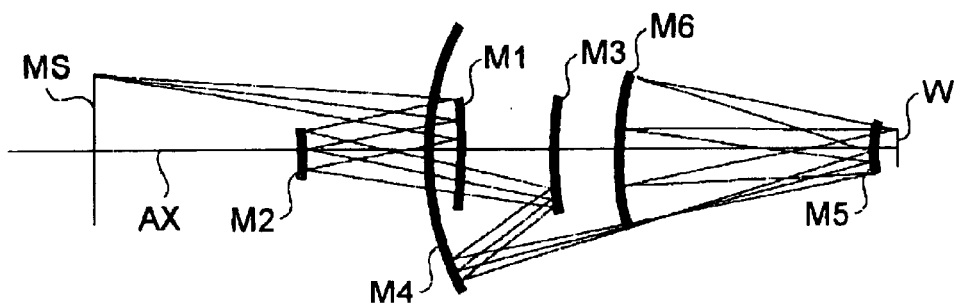
FIG. 1 is a schematic view of an optical system according to a first embodiment of the present invention.

Preferred embodiments of the present invention will now be described with reference to the attached drawings.

A projection optical system according to an embodiment of the present invention has a design wavelength 13.5 nm and a reduction magnification, and it has a basic structure of six mirrors including, in the order of reflection of light from an object plane side (reticle side), a concave mirror (mirror M1), a concave mirror (mirror M2), a convex mirror (mirror M3), a concave mirror (mirror M4), a convex mirror (mirror M5), and a concave mirror (mirror M6). Each of these six mirrors has a curvature radius having an absolute value not greater than 1500 mm.

Hence, in accordance with the present embodiment, there is provided a projection optical system for performing reduction projection of a pattern of a reticle by use of extreme ultraviolet (EUV) light having a wavelength not less than 10 nm and not greater than 20 nm, wherein the projection optical system includes six mirrors, that is, a first mirror M1 of concave surface shape, a second mirror M2 of concave surface shape, a third mirror M3 of convex surface shape, a fourth mirror M4 of concave surface shape, a fifth mirror M5 of convex surface shape, and a sixth mirror M6 of concave surface shape, disposed in the named order to sequentially reflect the light, and wherein each of the six mirrors has a curvature radius having an absolute value not greater than 1500 mm. As a result, a measuring machine (interferometer) to be used to measure the curvature radius of the mirrors or the surface shape of the reflection surface of the mirrors can be made compact. Additionally, the measurement precision for the surface shape of the six mirrors becomes very good, and thus the precision of the mirror surface shape can be improved significantly. Therefore, the imaging performance of the projection optical system can be improved notably. If there is a mirror having a curvature radius of an absolute value greater than 1500 mm, the measurement precision for the surface shape of such mirror would be degraded and the surface shape precision of that mirror would be deteriorated thereby. Therefore, it would be very difficult to improve the imaging performance of the projection optical system.

Preferably, five mirrors of the six mirrors may have a curvature radius having an absolute value not greater than 1300 mm (more preferably, not greater than 1250 mm). Alternatively, four mirrors of the six mirrors may preferably have a curvature radius having an absolute value not greater than 700 mm (more preferably, not greater than 630 mm). In the projection optical system according to the present embodiment, four mirrors M1–M4 are arranged to form an intermediate image which is in turn re-imaged by two mirrors M5 and M6 upon the image plane (wafer surface).

In the projection optical system according to this embodiment, among the six mirrors, the or each mirror having an effective diameter greater than 400 mm has a curvature radius having an absolute value not greater than 1000 mm. In Examples 1–3 to be described below, the mirror M4 is the mirror greater than 400 mm. However, any other mirror or mirrors may have a size greater than 400 mm.

At least one mirror of the six mirrors may have a reflection surface of aspherical surface shape. From the standpoint of aberration correction, many mirrors as much as possible may have a reflection surface of aspherical surface shape. It may be most desirable to provide all the six mirrors with a reflection surface of aspherical surface shape.

The projection optical system of this embodiment basically comprises a coaxial optical system being axially symmetrical with respect to a single optical axis, and aberration is corrected in terms of a ring-like (field of) image plane about the optical axis. However, for aberration correction or adjustment, at least one of the six mirrors may be disposed with small eccentricity.

In the projection optical system of this embodiment, the mirror M2 is the mirror that is disposed closest to the object plane. This is effective to make the diameter of the mirror M4 relatively small. As regards the positional relationship among the mirrors M1, M2 and M4, in respect to the mirror vertex position, the mirror M4 is disposed between the mirrors M1 and M2. This arrangement makes the diameter of the mirror M4 relatively small on one hand, and it makes the aspherical amount of the reflection surface of the mirrors M3 and M4 relatively small on the other hand.

Further, in relation to correction of the field curvature, the sum of the refractive powers of the reflection surfaces of the mirrors M1–M6 is made close to zero. More specifically, if the curvature radii of the mirrors M1–M6, close to the optical axis, are denoted by r1, r2, r3, r4, r5 and r6, respectively, the value $1/r1-1/r2+1/r3-1/r4+1/r5-1/r6$ is made equal to zero or close to zero.

In the projection optical system of this embodiment, the above-described conditions are satisfied and, in addition to it, other aberrations are corrected. Also, for enhanced practicality in regard to the size of the optical system, r1–r6 are set in the following ranges: $r1=-1400\pm100$, $r2=1200\pm100$, $r3=450\pm150$, $r4=600\pm200$, $r5=350\pm100$, $r6=500\pm100$.

The reflection surfaces of the mirrors M1–M6 are provided with a multilayered film for reflecting the extreme ultraviolet (EUV) light. Where the design wavelength is 13.5 nm as in the examples to be described later, a multilayered reflection surface, comprising Mo and Si, is provided.

An aperture stop is defined at or adjacent the mirror M2 position. The mirror M2 itself may function as an aperture stop, or alternatively, a separate aperture stop member or variable aperture stop member may be provided adjacent the mirror M2 to restrict or variably set the numerical aperture (NA).

Assuming that a reflection type reticle (mask) is mounted on the object plane, the projection optical system of this embodiment is designed as an optical system which is non-telecentric on the object side and is telecentric on the image side. Since the principal ray at the image plane side of the projection optical system emerges in parallel to the optical axis of the projection optical system, even if a photosensitive member (wafer) mounted on the image plane shifts in the optical axis direction, the change in magnification is small.

In the projection optical system of this embodiment, at least one mirror has an aspherical reflection surface having an aspherical surface shape Z that can be expressed by the following equation:

$$Z = ch^2/[1\,\text{SQRT}(1-(1+k)c^2h^2)] + Ah^4 + Bh^6 + Ch^8$$
$$+ Dh^{10} + Eh^{12} + Fh^{14} + Gh^{16} + Hh^{18}Jh^{20} + \ldots$$

where Z is the coordinates with respect to the optical axis direction, c is the curvature (inverse of curvature radius r), h is the height from the optical axis, k is the conic coefficient, and A, B, C, D, E, F, G, H, J and so on are aspherical coefficients of fourth-order, sixth-order, eighth-order, tenth-order, twelfth-order, fourteenth-order, sixteenth-order, eighteenth-order, twentieth-order, and so on. Here, the conic coefficient k means that the above-described aspherical surface is based on a hyperbola if k<0, a parabola if k=0, an ellipsoid (a plane obtainable by rotating an ellipse about its major axis) if 0<k<1, a spherical surface if k=1, and an ellipsoid (a plane obtainable by rotating an ellipse about its minor axis) if k>1.

For better aberration correction, in the projection optical system of this embodiment, the conic coefficient k1 of the mirror M1 satisfies a relation 50<k1<150 and, also, the conic coefficient k5 of the mirror M5 satisfies a relation 5<k5<20. The mirrors M1 and M5 have aspherical surfaces based on an oblate spheroid. More preferably, k1 may be set to satisfy a relation 80<k1<130 and k5 may be set to satisfy a relation 7.5<k5<12.

It is another feature of the projection optical system of this embodiment that an intermediate image is imaged at the midpoint (between M4 and M5). This makes the NA large and enables better aberration correction.

Specific examples of a projection optical system according to this embodiment of the present invention will be described below.

EXAMPLES

Figure 2:
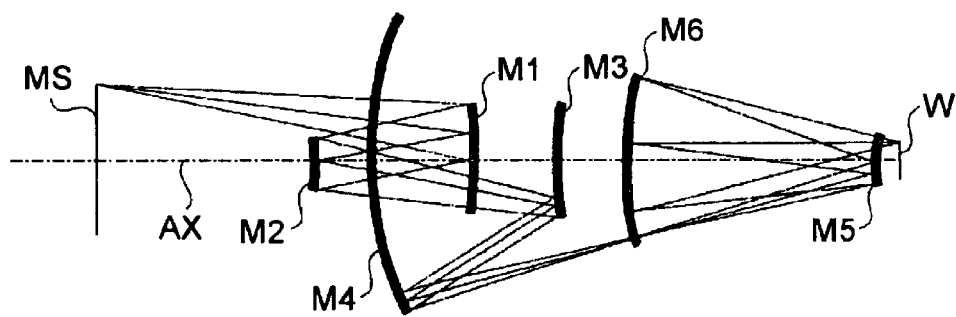
FIG. 2 is a schematic view of an optical system according to a second embodiment of the present invention.
Figure 3:
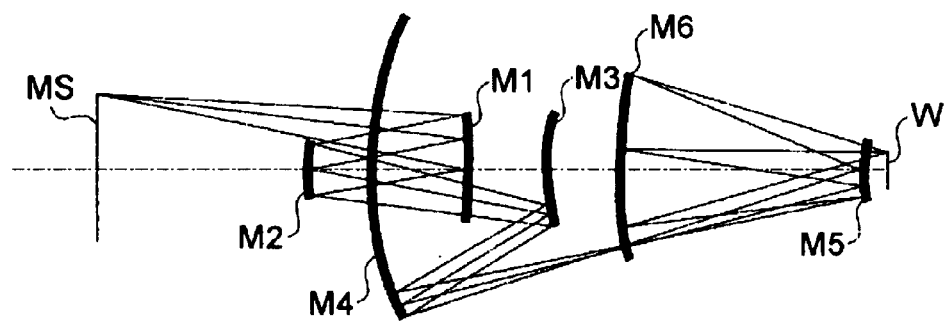
FIG. 3 is a schematic view of an optical system according to a third embodiment of the present invention.

FIGS. 1–3 illustrate optical paths in section of Example 1, Example 2 and Example 3, respectively, of a projection optical system according to this embodiment of the present invention. In these drawings, the same reference numerals are assigned to corresponding elements.

In FIGS. 1–3, denoted at MS is a reflection type reticle which is mounted at an object plane position. Denoted at W is a workpiece (wafer) to be exposed, and it is mounted at an image plane position. Denoted at M1 is a first mirror (concave mirror), and denoted at M2 is a second mirror (concave mirror). Denoted at M3 is a third mirror (convex mirror), and denoted at M4 is a fourth mirror (concave mirror). Denoted at M5 is a fifth mirror (convex mirror), and denoted at M6 is a sixth mirror (concave mirror). Denoted at AX is an optical axis.

As the reticle MS is illuminated with EUV light of a wavelength of about 13.5 nm, from an illumination optical system (not shown), in the projection optical system the EUV light from the reticle MS is reflected sequentially in the order of first mirror M1 (concave mirror), second mirror M2 (concave mirror), third mirror M3 (convex mirror), fourth mirror M4 (concave mirror), fifth mirror M5 (convex mirror) and sixth mirror M6 (concave mirror), whereby a reduced image of a device (circuit) pattern of the reticle is formed on the wafer W which is placed at the image plane position.

In Example 1, the projection optical system has a design wavelength λ=13.5 nm, NA=0.20, a reduction magnification of ¼, an arcuate object plane (region) with an object height of 125–135 mm, an arcuate image plane (region) with a width 2.5 mm, at an image height of 31.25–33.75 mm.

In Example 2, the projection optical system has a design wavelength λ=13.5 nm, NA=0.25, a reduction magnification of ¼, an arcuate object plane (region) with an object height of 128–136 mm, an arcuate image plane (region) with a width 2 mm, at an image height of 32–34 mm.

In Example 3, the projection optical system has a design wavelength λ=13.5 nm, NA=0.28, a reduction magnification of ¼, an arcuate object plane (region) with an object height of 132–136 mm, an arcuate image plane (region) with a width 1 mm, at an image height of 33–34 mm.

Tables 1–3 below show optical data (curvature radius, surface spacing, aspherical coefficient and so on) of the projection optical system according to Example 1, Example 2, and Example 3, respectively.

TABLE 1

Example 1:

| Mirror Number | Curvature Radius | Surface Spacing | Conical Coefficient k |
|---|---|---|---|
| MS(reticle) | INFINITY | 630.179916 | |
| M1 | −1417.99439 | −261.467870 | 108.912559 |
| M2 | 1239.25392 | 418.624113 | −0.359058 |
| M3 | 362.77769 | −201.547857 | 0.353432 |
| M4 | 474.63367 | 768.506284 | 0.044131 |
| M5 | 355.39768 | −433.958427 | 8.409102 |
| M6 | 516.18902 | 479.663841 | 0.087959 |
| W(Wafer) | INFINITY | | |

ASPHERICAL COEFFICIENT

| | | |
|---|---|---|
| M1: | A: 0.683291E−08 | B: 0.920316E−13 |
| | C: 0.569325E−17 | D: 0.336108E−22 |
| | E: 0.298242E−25 | F: −.192742E−29 |
| | G: 0.113727E−33 | H: 0.000000E+00 |
| | J: 0.000000E+00 | |
| M2: | A: −.527660E−09 | B: −.146866E−13 |
| | C: −.120097E−17 | D: 0.602378E−22 |
| | E: 0.202254E−24 | F: −.112453E−27 |
| | G: 0.173326E−31 | H: 0.000000E+00 |
| | J: 0.000000E+00 | |
| M3: | A: −.389938E−08 | B: −.193071E−13 |
| | C: 0.895942E−18 | D: −.339434E−22 |
| | E: −.285140E−26 | F: 0.286164E−30 |
| | G: −.777425E−35 | H: 0.000000E+00 |
| | J: 0.000000E+00 | |
| M4: | A: −.199437E−09 | B: 0.176911E−14 |
| | C: −.449370E−19 | D: 0.472723E−24 |
| | E: −.363016E−29 | F: 0.258718E−34 |
| | G: −.134850E−39 | H: 0.000000E+00 |
| | J: 0.000000E+00 | |
| M5: | A: −.222962E−07 | B: −.230654E−12 |
| | C: −.570785E−16 | D: −.805423E−20 |
| | E: 0.121605E−23 | F: 0.168015E−28 |
| | G: −.382728E−31 | H: 0.000000E+00 |
| | J: 0.000000E+00 | |
| M6: | A: −.293665E−10 | B: −.606092E−16 |
| | C: −.512438E−21 | D: 0.445912E−25 |
| | E: −.249950E−29 | F: 0.714531E−34 |
| | G: −.817258E−39 | H: 0.000000E+00 |
| | J: 0.000000E+00 | |

TABLE 2

Example 2:

| Mirror Number | Curvature Radius | Surface Spacing | Conical Coefficient k |
|---|---|---|---|
| MS(reticle) | INFINITY | 643.602181 | |
| M1 | −1447.35247 | −261.656816 | 101.944633 |
| M2 | 1215.95679 | 405.854887 | 0.642114 |
| M3 | 455.18256 | −300.124352 | 1.824126 |
| M4 | 608.71774 | 865.720173 | 0.041252 |
| M5 | 348.99083 | −432.357964 | 10.791670 |
| M6 | 515.45674 | 476.357972 | 0.089726 |
| W(wafer) | INFINITY | | |

TABLE 2-continued

Example 2:

ASPHERICAL COEFFICIENT

| | | |
|---|---|---|
| M1: | A: 0.609140E−08 | B: 0.699773E−13 |
| | C: 0.418382E−17 | D: 0.285464E−22 |
| | E: 0.195221E−25 | F: −.223251E−29 |
| | G: 0.243045E−33 | H: −.131967E−37 |
| | J: 0.353573E−42 | |
| M2: | A: −.520732E−09 | B: −.158879E−13 |
| | C: 0.199750E−18 | D: −.272652E−20 |
| | E: 0.391908E−23 | F: −.323621E−26 |
| | G: 0.154875E−29 | H: −.400536E−33 |
| | J: 0.433411E−37 | |
| M3: | A: −.361756E−08 | B: −.100951E−13 |
| | C: −.188622E−17 | D: 0.137421E−21 |
| | E: −.435870E−27 | F: −.807975E−30 |
| | G: 0.416642E−34 | H: 0.745306E−39 |
| | J: −.744094E−43 | |
| M4: | A: −.708692E−11 | B: −.587545E−15 |
| | C: 0.415278E−20 | D: 0.233903E−25 |
| | E: −.428472E−30 | F: −.288671E−35 |
| | G: 0.446209E−40 | H: 0.204972E−45 |
| | J: −.274443E−50 | |
| M5: | A: −.290931E−07 | B: −.100431E−11 |
| | C: −.126109E−15 | D: −.580717E−20 |
| | E: −.249237E−24 | F: 0.990307E−28 |
| | G: −.215115E−30 | H: 0.737415E−34 |
| | J: −.863420E−38 | |
| M6: | A: −.267143E−10 | B: −.448332E−16 |
| | C: −.774133E−21 | D: 0.126998E−24 |
| | E: −.131738E−28 | F: 0.876886E−33 |
| | G: −.358801E−37 | H: 0.820550E−42 |
| | J: −.801112E−47 | |

TABLE 3

Example 3:

| Mirror Number | Curvature Radius | Surface Spacing | Conical Coefficient k |
|---|---|---|---|
| MS(reticle) | INFINITY | 644.850299 | |
| M1 | −1423.28830 | −264.078564 | 100.234610 |
| M2 | 1218.20499 | 405.736540 | 0.789243 |
| M3 | 446.68480 | −291.988234 | 1.752538 |
| M4 | 598.88100 | 861.479959 | 0.029391 |
| M5 | 349.11713 | −432.237976 | 10.738888 |
| M6 | 515.55439 | 476.237976 | 0.090117 |
| W(wafer) | INFINITY | | |

ASPHERICAL COEFFICIENT

| | | |
|---|---|---|
| M1: | A: 0.627121E−08 | B: 0.755850E−13 |
| | C: 0.428200E−17 | D: 0.622819E−22 |
| | E: 0.161861E−25 | F: −.179291E−29 |
| | G: 0.213411E−33 | H: −.119178E−37 |
| | J: 0.337956E−42 | |
| M2: | A: −.519569E−09 | B: −.152324E−13 |
| | C: 0.827001E−18 | D: −.447137E−20 |
| | E: 0.643682E−23 | F: −.530372E−26 |
| | G: 0.253310E−29 | H: −.653936E−33 |
| | J: 0.706349E−37 | |
| M3: | A: −.376490E−08 | B: −.152265E−13 |
| | C: −.157948E−17 | D: 0.153611E−21 |
| | E: −.436540E−26 | F: −.856327E−30 |
| | G: 0.895218E−34 | H: −.290000E−38 |
| | J: 0.162538E−43 | |
| M4: | A: −.358812E−11 | B: −.590866E−15 |
| | C: 0.420854E−20 | D: 0.267696E−25 |
| | E: −.475021E−30 | F: −.372201E−35 |
| | G: 0.729697E−40 | H: −.717295E−46 |
| | J: −.180920E−50 | |
| M5: | A: −.292071E−07 | B: −.992125E−12 |
| | C: −.118939E−15 | D: −.753027E−20 |

TABLE 3-continued

Example 3:

| | | |
|---|---|---|
| | E: −.578063E−24 | F: 0.886658E−27 |
| | G: −.595140E−30 | H: 0.157698E−33 |
| | J: −.159492E−37 | |
| M6: | A: −.274252E−10 | B: −.467321E−16 |
| | C: −.124139E−20 | D: 0.193090E−24 |
| | E: −.193399E−28 | F: 0.124502E−32 |
| | G: −.495959E−37 | H: 0.111156E−41 |
| | J: −.106975E−46 | |

The aberration of the projection optical systems in the preceding examples of this embodiment is as follows:

Example 1: wavefront aberration=0.031 λrms; distortion (range)=8 nm

Example 2: wavefront aberration=0.010 λrms; distortion (range)=1.2 nm

Example 3: wavefront aberration=0.027 λrms; distortion (range)=0.9 nm

Thus, in these examples, a diffraction limited optical system in regard to the wavelength 13.5 nm was accomplished.

In the projection optical systems according to Examples 1–3, the image plane (region) has an arcuate shape (ring-like shape) and, therefore, where a projection optical system of any one these examples is incorporated into a projection exposure apparatus, the exposure method to be used is such that a reticle and a wafer are scanningly moved in the widthwise direction of this arcuate shape at a speed ratio the same as the reduction magnification of the projection optical system by which the exposure regions (to be exposed) on the wafer (normally, plural regions are disposed in array) are exposed with the whole reticle pattern.

It should be noted here that the present embodiment is not limited to the examples described above. The structure may be changed within the scope of the present invention to improve the performance.

Next, an exposure apparatus into which a projection optical system according to the present invention is incorporated, will be described. The exposure apparatus of the present invention may use extreme ultraviolet (EUV) light having a wavelength of 13.4 nm, for example, as illumination light for the exposure process. Further, as described hereinbefore, the image plane of a projection optical system 100 has an arcuate shape (ring-like shape), and the exposure method used is such that the whole surface of the reticle is exposed (transferred) by scanningly moving the reticle and the wafer at a speed ratio corresponding to the reduction magnification.

Figure 4:
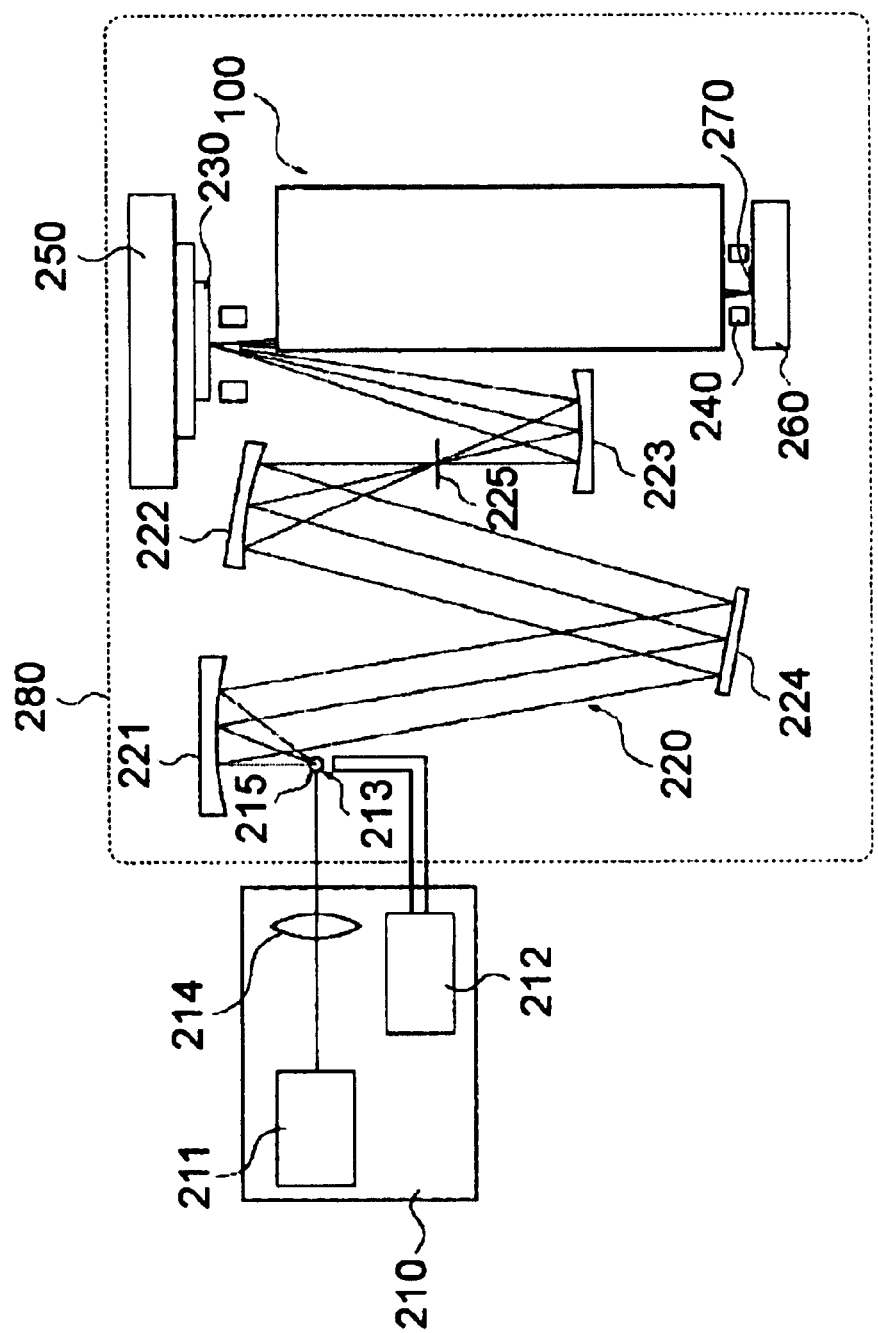
FIG. 4 is a schematic view of an exposure apparatus according to an embodiment of the present invention.

Referring to FIG. 4, the exposure apparatus has an extreme ultraviolet (EUV) light source 210, an illumination optical system 220, a reflection type reticle 230, an alignment optical system 240, a projection optical system 100, a reticle stage 250, a wafer stage 260, and a wafer 270.

Since the EUV light has a very low transmissivity with respect to an atmospheric air, preferably the light path along which the EUV light passes may be maintained in a vacuum ambience. To this end, the path from the illumination optical system 220 to the wafer stage 260 is accommodated in a vacuum container 280.

The EUV light source 210 of this embodiment may comprise a laser plasma light source, for example. In the laser plasma light source 210, a large-intensity pulse laser light is projected onto a target member 213, supplied by a target supplying device 211 and placed inside the vacuum container 280, from a pulse laser 211 and through a condenser lens 214, whereby high temperature plasma 215 is produced. From this plasma, EUV light of a wavelength of about 13.4 nm is emitted and it is used. The target member 213 may comprise a metal thin film, an inactive gas or liquid drops. It is supplied into the vacuum container 280 by means of the target supplying device which may comprise a gas jet, for example.

The illumination optical system 220 illuminates the reticle 230 by propagating the EUV light. In FIG. 3, the illumination optical system 220 includes first, second and third mirrors 221, 222 and 223, an optical integrator 224, and an aperture 225. The first mirror 221 functions to collect EUV light having been emitted isotropically from the plasma 215. The optical integrator 224 serves to uniformly illuminate the reticle 230, with a predetermined numerical aperture. Here, the EUV light is relayed to the reticle 230 by means of the second and third mirrors 222 and 223. The aperture 225 is disposed at a position in the illumination optical system which position is optically conjugate with the reticle 230, and it functions to restrict the illumination region upon the reticle 230, to be illuminated, into an arcuate shape.

The reticle stage 250 and the wafer stage 260 are provided with a scanning mechanism by which they are scanningly moved in synchronism with each other, at a speed ratio proportional to the reduction magnification. Here, within the plane of the reticle 230 or wafer 270, the scan direction is referred to as X direction, and a direction perpendicular thereto is referred to as Y direction. The direction perpendicular to the plane of the reticle 230 or wafer 270 is referred to as Z direction.

The reticle 230 is formed with a desired pattern, and it is held by a reticle chuck (not shown) mounted on the reticle stage 250. The reticle stage 250 is provided with a driving mechanism for moving it in X direction. Also, it has a fine-motion mechanism with respect to each of X, Y and Z directions as well as rotational directions about these axes, such that the reticle 230 can be positioned precisely. The position and attitude of the reticle stage 250 are measured by laser interferometers, and the position and attitude are controlled on the basis of the result of measurement. In this embodiment, the reticle 230 is a reflection type reticle. However, either a transmission type reticle or a reflection type reticle may be used.

The wafer 270 is held on the wafer stage 260 by means of a wafer chuck, not shown. Like the reticle stage 250, the wafer stage 260 is provided with a driving mechanism for moving it in X direction. Also, it has a fine-motion mechanism with respect to each of X, Y and Z directions as well as rotational directions about these axes, such that the wafer 270 can be positioned precisely. The position and attitude of the wafer stage 260 are measured by laser interferometers, and the position and attitude are controlled on the basis of the result of measurement.

The alignment detecting optical system 240 functions to measure the positional relationship between the position of the reticle 230 and the optical axis of the projection optical system 100, as well as the positional relationship between the position of the wafer 270 and the optical axis of the projection optical system 100. On the basis of the measurement, the positions and angles of the reticle stage 250 and the wafer stage 260 are set so that a projected image of the reticle 230 is registered with a predetermined position on the wafer 270. Further, a focus detecting optical system (not shown) is provided to measure the focus position of the wafer 270 surface with respect to Z direction. By controlling the position and angle of the wafer stage 260 on the basis of the measurement, the wafer surface can be held at the imaging position of the projection optical system 100, constantly during the exposure process.

When a single scan exposure on the wafer 270 is completed, the wafer stage 260 is moved stepwise in X and Y directions, toward a next scan exposure start position, and then the reticle stage 250 and the wafer stage 260 are scanningly moved again in X direction, at a speed ratio proportional to the reduction magnification of the projection optical system.

In this manner, the operation that the reticle 230 and the wafer 270 are synchronously scanningly moved while a reduced projected image of the reticle 230 is being imaged on the wafer 270 is repeated (step-and-scan), and the pattern of the reticle 230 is transferred to the whole surface of the wafer 270.

Next, referring to FIGS. 5 and 6, an embodiment of a device manufacturing method which uses an exposure apparatus described above, will be explained.

Figure 5:
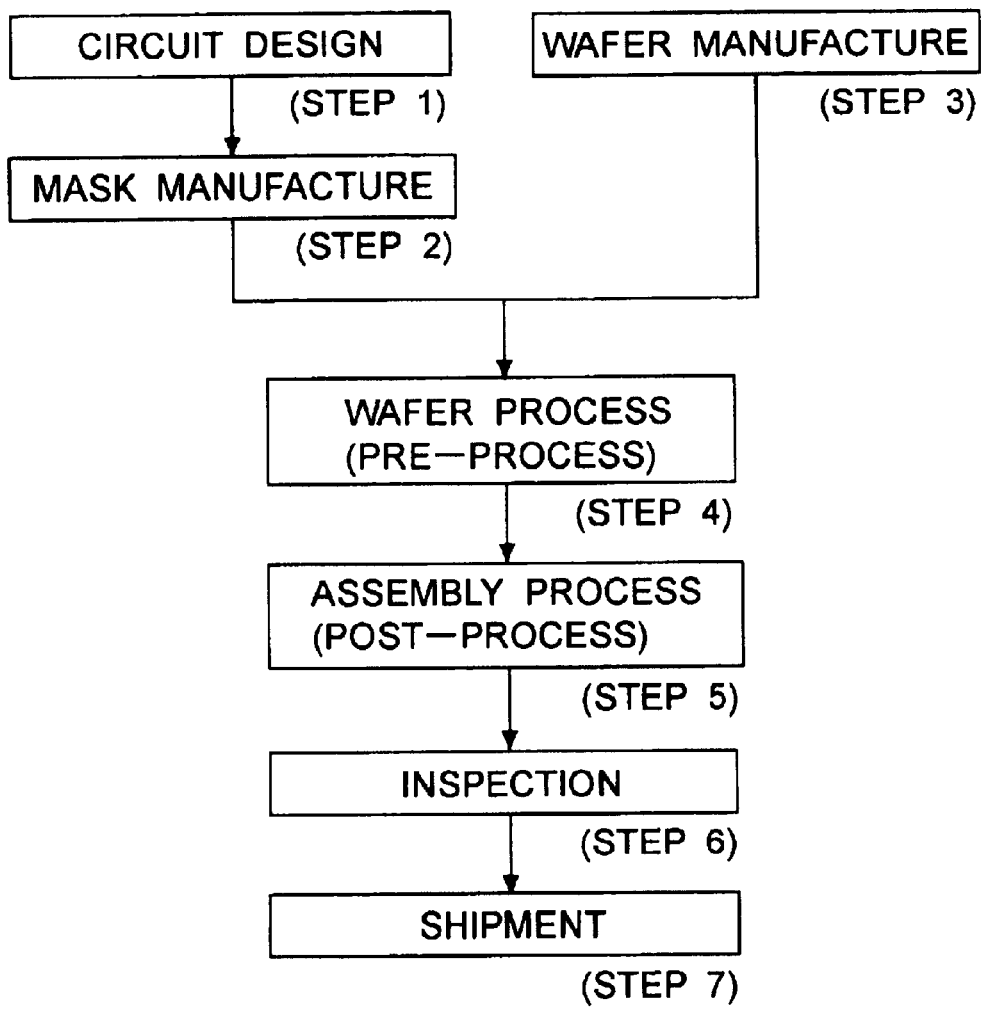
FIG. 5 is a flow chart for explaining semiconductor device manufacturing processes.

FIG. 5 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 6:
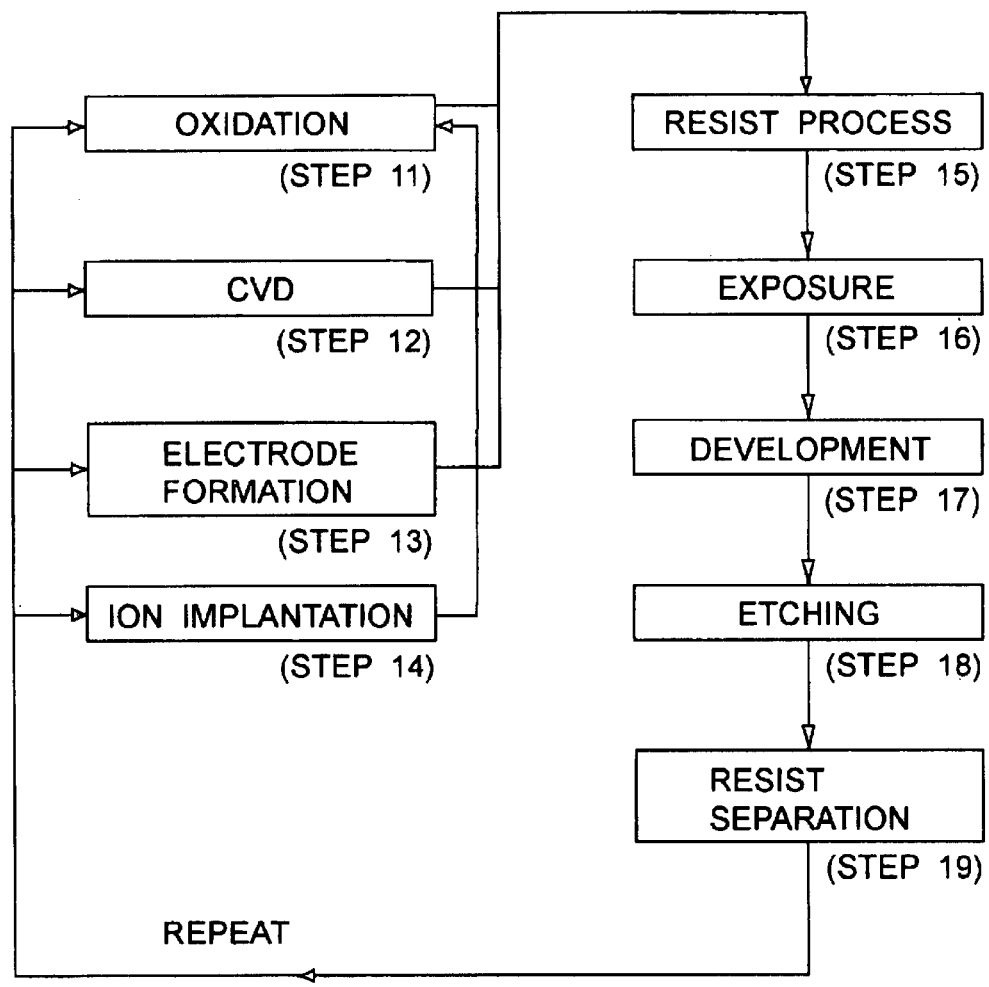
FIG. 6 is a flow chart for explaining details of a wafer process, in the procedure of the flow chart of FIG. 5.

FIG. 6 is a flow chart for explaining details of the wafer process, at step 4 in FIG. 5. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the present invention has been described with reference to some preferred embodiments, the invention is not limited to these embodiments. Many modifications and changes are possible within the scope of the invention.

In accordance with the embodiments of the present invention described hereinbefore, a projection optical system with which the imaging performance can be improved significantly is accomplished.

While the invention has been described with reference to the structures disclosed herein, it is not confined to the details set forth and this application is intended to cover such modifications or changes as may come within the purposes of the improvements or the scope of the following claims.

What is claimed is:

1. A projection optical system for performing reduction projection of a pattern of a reticle, said projection optical system comprising:

a first mirror having a concave surface shape;

a second mirror having a concave surface shape;

a third mirror having a convex surface shape;

a fourth mirror having a concave surface shape;

a fifth mirror having a convex surface shape; and a sixth mirror having a concave surface shape, wherein said first to sixth mirrors are disposed in the named order along an optical path from the reticle side, wherein each of the six mirrors has a curvature radius having an absolute value not greater than 1500 mm, and wherein said projection optical system is arranged to produce, between said fourth mirror and said fifth mirror, an intermediate image of a pattern of the reticle.

2. A projection optical system according to claim 1, further comprising an aperture stop disposed adjacent said second mirror.

3. A projection optical system according to claim 1, wherein, among the six mirrors, said second mirror has a curvature radius having a largest absolute value.

4. A projection optical system according to claim 1, wherein, among the six mirrors, said first mirror has a curvature radius having a largest absolute value.

5. A projection optical system according to claim 1, wherein, among the six mirrors, said second mirror is disposed closest to the reticle.

6. A projection optical system according to claim 1, wherein, among the six mirrors, the or each mirror having an effective diameter greater than 400 mm has a curvature radius having an absolute value not greater than 1000 mm.

7. A projection optical system according to claim 1, wherein each of the six mirrors has a reflection surface of aspherical shape.

8. A projection optical system according to claim 1, wherein five mirrors of the six mirrors have a curvature radius having an absolute value not greater than 1300 mm.

9. A projection optical system according to claim 1, wherein five mirrors of the six mirrors have a curvature radius having an absolute value not greater than 1250 mm.

10. A projection optical system according to claim 1, wherein four mirrors of the six mirrors have a curvature radius having an absolute value not greater than 700 mm.

11. A projection optical system according to claim 1, wherein four mirrors of the six mirrors have a curvature radius having an absolute value not greater than 630 mm.

12. A projection optical system according to claim 1, wherein said first mirror has a conic coefficient k1 that satisfies a relation $50<k1<150$.

13. A projection optical system according to claim 1, wherein said first mirror has a conic coefficient k1 that satisfies a relation $80<k1<130$.

14. A projection optical system according to claim 1, wherein said fifth mirror has a conic coefficient k5 that satisfies a relation $5<k5<20$.

15. A projection optical system according to claim 1, wherein said fifth mirror has a conic coefficient k5 that satisfies a relation $7.5<k5<12$.

16. A projection optical system according to claim 1, wherein said projection optical system performs reduction projection of the reticle pattern by use of extreme ultraviolet light.

17. A projection optical system according to claim 1, wherein said projection optical system is constituted only by said first, second, third, fourth, fifth and sixth mirrors.

18. An exposure apparatus, comprising:

a projection optical system as recited in claim 1, for performing reduction projection of a pattern of a reticle; and an illumination optical system for illuminating the reticle with extreme ultraviolet light.

19. An apparatus according to claim 18, wherein said projection optical system is constituted only by the first, second, third, fourth, fifth and sixth mirrors, and wherein the extreme ultraviolet light from the reticle is directed by these six mirrors to a substrate to be exposed.

20. A device manufacturing method, comprising the steps of:

exposing a substrate with a device pattern by use of an exposure apparatus as recited in claim 18; and developing the exposed substrate.

* * * * *

UNITED STATES PATENT AND TRADEMARK OFFICE
CERTIFICATE OF CORRECTION

PATENT NO. : 6,995,829 B2
APPLICATION NO. : 10/699933
DATED : February 7, 2006
INVENTOR(S) : Masayuki Suzuki It is certified that error appears in the above-identified patent and that said Letters Patent is hereby corrected as shown below:

COLUMN 1:
  Line 27, "is very the" should read -- is the --.

COLUMN 5:
  Lines 1-3, "$Z=ch^2/[1SQRT(1-(1+k)c^2h^2)]+Ah^4+Bh^6+Ch^8$ $+Dh^{10}+Eh^{12}+Fh^{14}+Gh^{16}+Hh^{18}Jh^{20}+ ...$ " should read -- $Z=ch^2/[1+SQRT(1-(1+k)c^2h^2)]+Ah^4+Bh^6+Ch^8$ $+Dh^{10}+Eh^{12}+Fh^{14}+Gh^{16}+Hh^{18}+Jh^{20}+ ...$ --.

Line 34, "section" should read -- sections --.
  Line 62, "of, 1/4," should read -- of 1/4, --.

COLUMN 8:
  Line 29, "one these" should read -- one of these --.

COLUMN 10:
  Line 13, "operation that" should read -- operation wherein --.
  Line 38, "an so on, " should read -- and so on, --.

Signed and Sealed this

Eighth Day of August, 2006

JON W. DUDAS
*Director of the United States Patent and Trademark Office*